(12) United States Patent
Ko et al.

(10) Patent No.: US 12,727,454 B2
(45) Date of Patent: Sep. 1, 2026

(54) SEMICONDUCTOR DEVICE AND METHOD OF MANUFACTURING

(71) Applicant: Taiwan Semiconductor Manufacturing Co., Ltd., Hsinchu (TW)

(72) Inventors: Chung-Ting Ko, Kaohsiung City (TW); Yu-Cheng Shiau, Hsinchu (TW); Li-Jung Kuo, Zhubei City (TW); Sung-En Lin, Xionglin Township (TW); Kuo-Chin Liu, Ji-an Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 615 days.

(21) Appl. No.: 18/152,477

(22) Filed: Jan. 10, 2023

(65) Prior Publication Data

US 2024/0087947 A1 Mar. 14, 2024

(51) Int. Cl.

| | |
|---|---|
| ***H10W 10/10*** | (2026.01) |
| ***H10D 62/10*** | (2025.01) |
| ***H10P 14/60*** | (2026.01) |
| ***H10P 14/694*** | (2026.01) |
| ***H10P 50/28*** | (2026.01) |
| ***H10W 10/00*** | (2026.01) |

(52) U.S. Cl.

CPC .......... *H10W 10/10* (2026.01); *H10D 62/124* (2025.01); *H10P 14/6319* (2026.01); *H10P 14/69433* (2026.01); *H10P 50/283* (2026.01); *H10W 10/011* (2026.01)

(58) Field of Classification Search

CPC .. H10D 30/024; H10D 30/62; H10D 30/6212; H10D 84/0158; H10D 84/834; H01L 21/3111; H01L 21/02126; H01L 21/02211; H01L 21/02274; H10P 14/6319; H10P 14/6336; H10P 14/6339; H10P 14/69433; H10P 14/6682; H10P 14/6922

See application file for complete search history.

(56) References Cited

U.S. PATENT DOCUMENTS

| | | | | |
|---|---|---|---|---|
| 2013/0207122 | A1* | 8/2013 | Lin | H10D 30/62 257/E21.573 |
| 2015/0179501 | A1 | 6/2015 | Jhaveri et al. | |
| 2016/0322462 | A1* | 11/2016 | Chou | H10D 30/62 |
| 2019/0027556 | A1* | 1/2019 | Shu | H01L 21/3105 |
| 2019/0074225 | A1* | 3/2019 | Yang | H10D 84/0167 |

(Continued)

FOREIGN PATENT DOCUMENTS

| | | |
|---|---|---|
| CN | 106601680 A | 4/2017 |
| TW | 1576902 B | 4/2017 |
| TW | 1627679 | 6/2018 |

*Primary Examiner* — Alexander G Ghyka
(74) *Attorney, Agent, or Firm* — Slater Matsil, LLP

(57) ABSTRACT

A semiconductor device and method of manufacture are provided. In some embodiments isolation regions are formed by modifying a dielectric material of a dielectric layer such that a first portion of the dielectric layer is more readily removed by an etching process than a second portion of the dielectric layer. The modifying of the dielectric material facilitates subsequent processing steps that allow for the tuning of a profile of the isolation regions to a desired geometry based on the different material properties of the modified dielectric material.

20 Claims, 23 Drawing Sheets

(56) References Cited

U.S. PATENT DOCUMENTS

| | | | | |
|---|---|---|---|---|
| 2019/0273011 | A1* | 9/2019 | Sung | H10P 14/6308 |
| 2020/0098616 | A1* | 3/2020 | Peng | H01L 21/02164 |
| 2020/0135550 | A1* | 4/2020 | Chen | H10D 30/62 |
| 2022/0059471 | A1* | 2/2022 | Huang | H10D 84/038 |
| 2023/0066828 | A1* | 3/2023 | Jang | H10D 30/0243 |

* cited by examiner 72
52
52
60
50
56

SEMICONDUCTOR DEVICE AND METHOD OF MANUFACTURING

PRIORITY CLAIM AND CROSS-REFERENCE

This application claims the benefit of U.S. Provisional Application No. 63/375,646, entitled: "Semiconductor Device and Method of Manufacturing," filed on Sep. 14, 2022, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
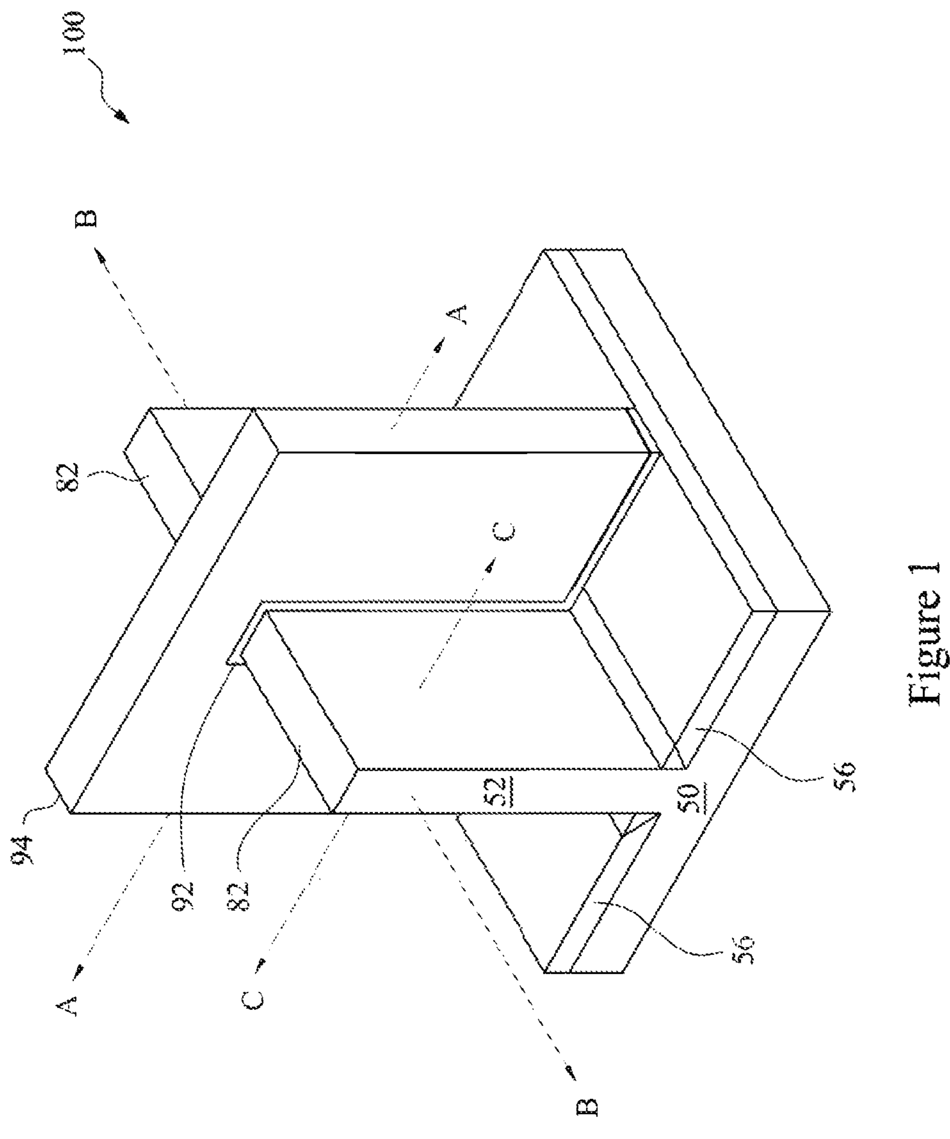
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to particular embodiments which form isolation regions with selectively tuned geometric profiles in a fin field effect transistor (finFET). However, the embodiments described herein may be applied in a wide variety of devices and methods, such as nanostructure transistors, and all such embodiments are fully intended to be included within the scope of the embodiments.

FIG. 1 illustrates an example of a FinFET 100 in a three-dimensional view, in accordance with some embodiments. The FinFET 100 comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a first top surface of the fin 52, and a gate electrode 94 is over the gate dielectric layer 92. Source/drain regions 82 are disposed in opposite sides of the fin 52 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET 100. Cross-section B-B is perpendicular to cross-section A-A and is along a longitudinal axis of the fin 52 and in a direction of, for example, a current flow between the source/drain regions 82 of the FinFET 100. Cross-section C-C is parallel to cross-section A-A and extends through a source/drain region of the FinFET 100. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 2 through 19B are cross-sectional views of intermediate stages in the manufacturing of FinFETs 100, in accordance with some embodiments. FIGS. 2 through 10 illustrate reference cross-section A-A illustrated in FIG. 1, except for multiple fins/FinFETs. FIGS. 11A, 12A, 13A, 14A, 15A, 16A, 17A, 18A, and 19A are illustrated along reference cross-section A-A illustrated in FIG. 1, and FIGS. 11B, 12B, 13B, 14B, 15B, 16B, 17B, 17C, 18B, and 19B are illustrated along a similar cross-section B-B illustrated in FIG. 1, except for multiple fins/FinFETs. FIGS. 13C and 13D are illustrated along reference cross-section C-C illustrated in FIG. 1, except for multiple fins/FinFETs.

Figure 2:
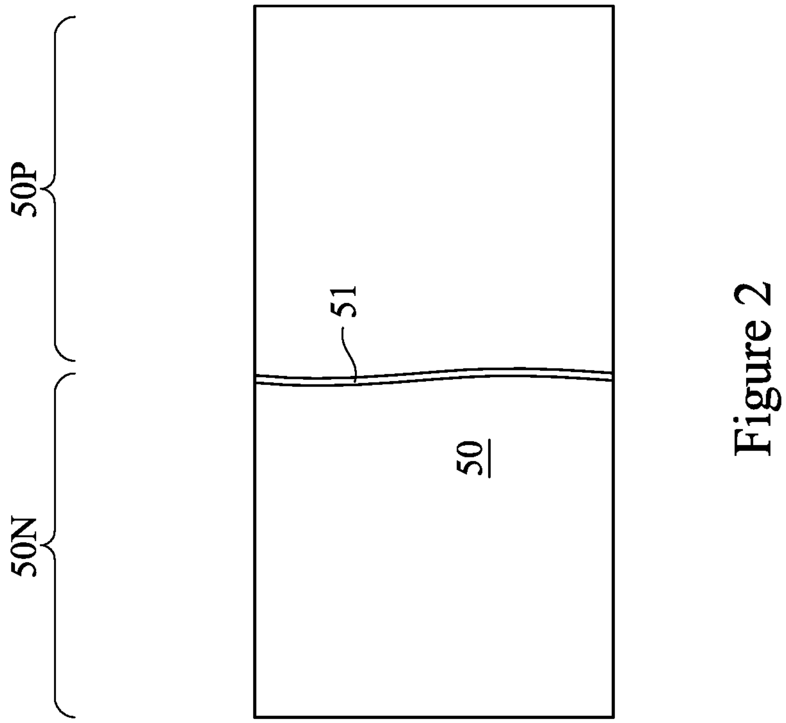
FIGS. 2 and 3 are cross-sectional views that illustrate a formation of semiconductor fins, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a region SON and a region 50P. The region SON can be for forming n-type devices, such as NMOS transistors, e.g., n-type FinFETs. The region 50P can be for forming p-type devices, such as PMOS transistors, e.g., p-type FinFETs. The region SON may or may not be physically separated from the region 50P (as illustrated by divider 51), and any number of device features (e.g., other active devices, doped regions, isolation structures, etc.) may be disposed between the region SON and the region 50P.

Figure 3:
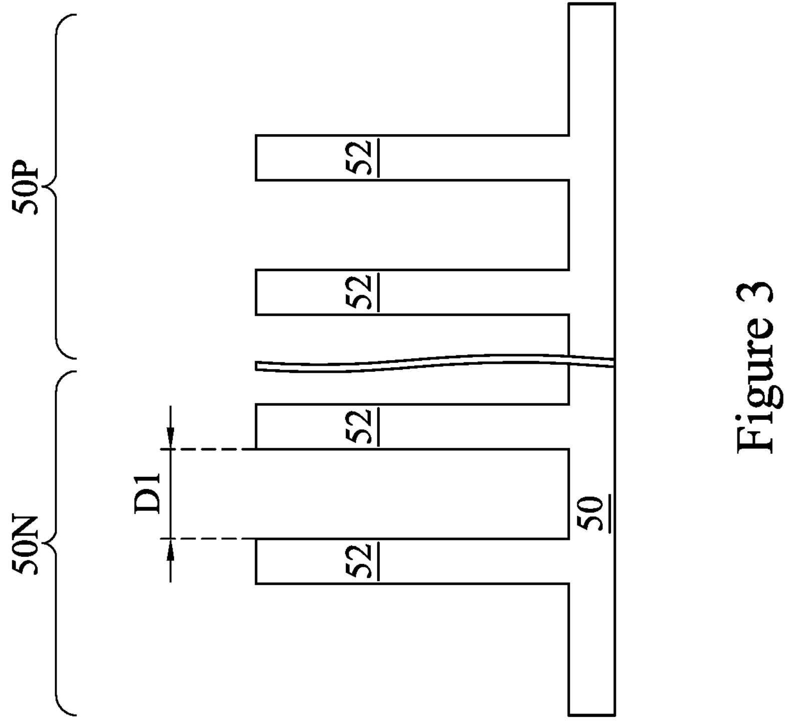

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the fins 52 are formed such that neighboring fins 52 have a first distance D1, the first distance D1 in the range of 10 nm to 80 nm.

Figure 4:
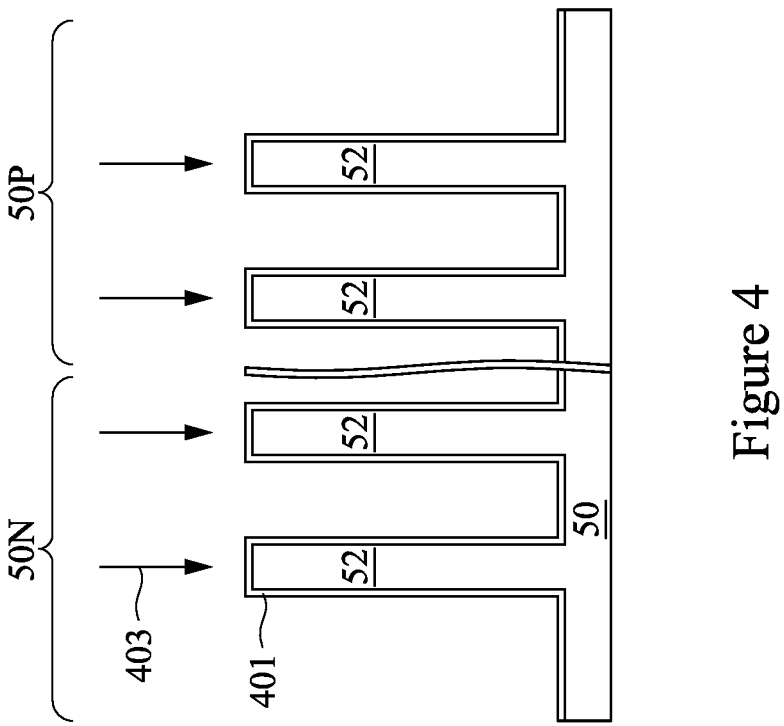
FIGS. 4, 5, 6, 7, 8, and 9 are cross-sectional views that illustrate a formation of a trench isolation structure, in accordance with some embodiments.

In FIG. 4, a first precursor film 401, such as a first monolayer, is formed on exposed surfaces of the fins 52 (i.e. vertical sidewalls of the fins 52 and the first top surface of the fins 52) as well as on exposed portions of the substrate 50 (e.g. a second top surface of the substrate 50 between neighboring fins 52). In some embodiments, the first precursor film 401 may comprise a first precursor used to form a first dielectric material 503 and a second dielectric material 505 (not illustrated in FIG. 4 but illustrated and discussed further below with respect to FIG. 5). In accordance with some embodiments the first precursor film 401 may be deposited by an atomic layer deposition (ALD) process or a conformal chemical vapor deposition (CVD) process. However, any suitable deposition process may be utilized.

Figure 6:
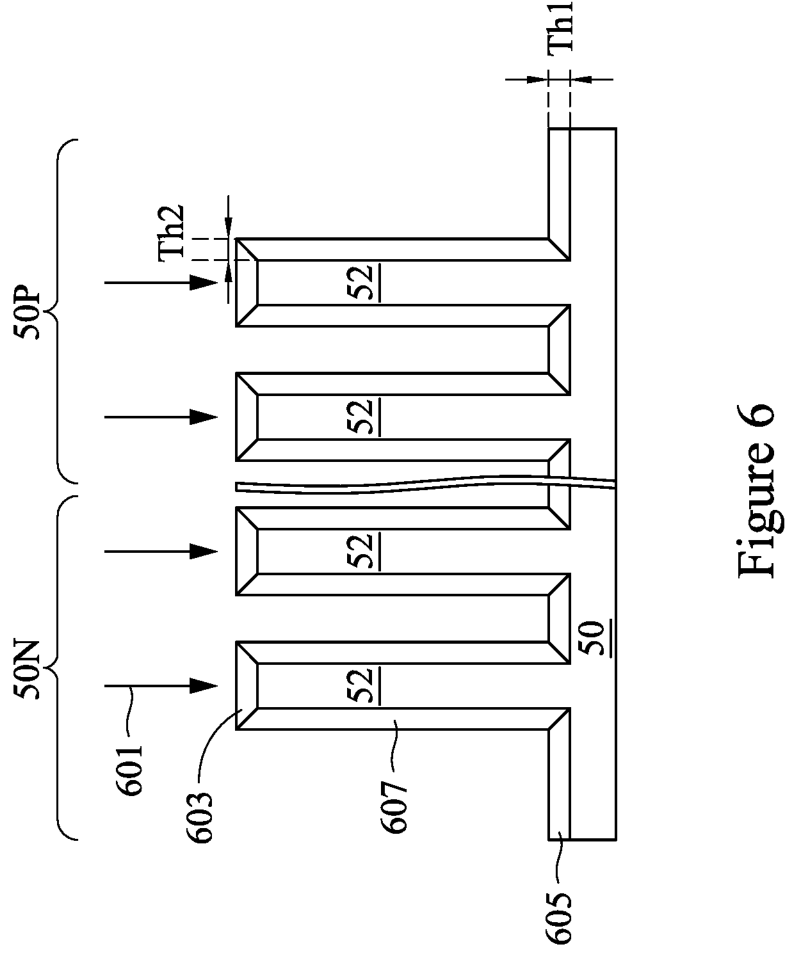

In accordance with some embodiments in which an ALD process is utilized, the first precursor film 401 is deposited over the fins 52 and over the substrate 50 during an initial iteration of a first half-cycle step 403 of a first deposition process 601 (see FIG. 6). The first half-cycle step 403 forms the first precursor film 401 by introducing through an ALD process one or more precursors comprising a first element of the first dielectric material 503 and the second dielectric material 505.

For example, in an embodiment wherein the first dielectric material 503 and the second dielectric material 505 comprise silicon, such as silicon nitride, silicon oxide, silicon carbide, or the like, the first precursor film 401 may be formed by carrying out one or more precursor-forming steps (e.g. a silicon-forming step forming a film comprising silicon over the fins 52 and over the substrate 50). In some embodiments, the silicon-forming step may be performed using silicon-forming precursors such as $SiH_4$, $SiH_2Cl_2$, $SiH_2I_2$, the like, or combinations thereof. The silicon-forming step may be performed in a process chamber (not separately illustrated) at a process temperature in the range of 250° C. to 400° C., though other temperatures may be used. In some embodiments, the silicon-forming step precursors may be pulsed into the process chamber at a flow rate in the range of 5 sccm to 100 sccm, for a pulse duration in the range of 0.1 seconds to 0.5 seconds. The silicon-forming step may have a pressure in the range of 10 Torr to 30 Torr. After pulsing the silicon-forming step precursors, a purge may be performed for a duration in the range of 0.1 seconds to 5 seconds. After the silicon-forming step the film (e.g. the first precursor film 401) comprises reactive bonding sites of silicon formed on the exposed surfaces of the fins 52 and on the exposed surfaces of the substrate 50.

Figure 5:
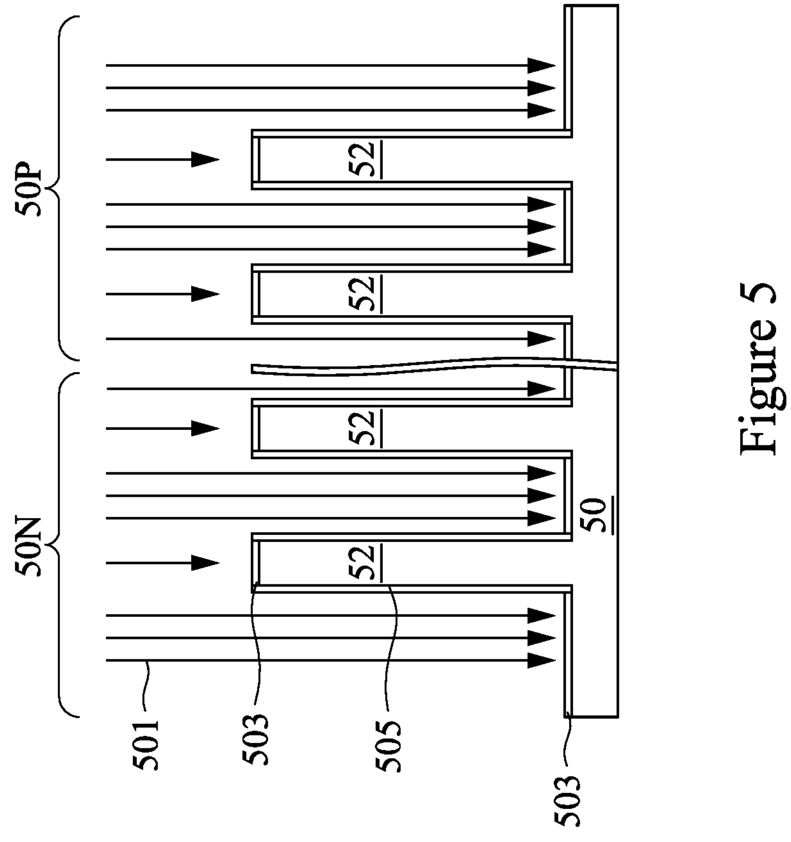

In FIG. 5, the first dielectric material 503 and the second dielectric material 505 are formed by performing a second half-cycle step 501. The second half-cycle step 501 introduces one or more precursors comprising a second element of the first dielectric material 503 and the second dielectric material 505 by an ALD process to the first precursor film 401. During the second half-cycle step 501 the second element introduced by the one or more precursors may react and bond with the first element at the reactive bonding sites present in the first precursor film 401 to form the first dielectric material 503 and the second dielectric material 505.

For example, in an embodiment wherein the first dielectric material 503 and the second dielectric material 505 comprises nitrogen, such as silicon nitride, and the first half-cycle step 403 utilized the silicon forming step, a nitrogen-forming step may be performed using nitrogen-forming precursors such as $N_2$, $NH_3$, the like, or combinations thereof during the second half-cycle step 501. The second half-cycle step 501 introduces nitrogen as the second element used in forming the first dielectric material 503 and the second dielectric material 505. The nitrogen-forming step may be performed in a process chamber (not separately illustrated) at a process temperature in the range of 250° C. to 400° C., though other temperatures may be used. The nitrogen-forming step precursors may be pulsed into the process chamber at a flow rate in the range of 10 sccm to 500 sccm, for a pulse duration in the range of 0.1 seconds and 1 second. The nitrogen-forming step may have a pressure in the range of 10 Torr to 30 Torr. After pulsing the nitrogen-forming step precursors, a purge may be performed for a duration in the range of 0.1 seconds to 1 second. The nitrogen produced during the nitrogen-forming step able to bond with the silicon produced during the silicon-forming step.

In an embodiment, the first dielectric material 503 and the second dielectric material 505 are formed during the second half-cycle step 501 by an ALD process performed using an anisotropic plasma. Performing the second half-cycle step 501 using the anisotropic plasma directionally deposits the precursors utilized in the ALD process of the second half-cycle step 501 onto the first precursor film 401. In this embodiment, the anisotropic plasma utilized during the ALD process of the second half-cycle step 501 may be generated either remotely (e.g., by a remote plasma) or else may be generated in the deposition chamber itself, and may be generated by a radio-frequency (RF) power for a duration in the range of 0.1 seconds to 5 seconds. The plasma may be generated by the RF power, the RF power in the range of 100 Watts to 800 Watts.

In this embodiment, during the ALD process of the second half-cycle step 501 using the anisotropic plasma a higher concentration of the precursors are deposited vertically downward onto the first precursor film 401 such that a greater amount of the precursors utilized during the second half-cycle step 501 are introduced onto horizontal portions of the first precursor film 401 than are introduced onto vertical portions of the first precursor film 401. In this embodiment a greater quantity of the second element is able to react with the first element on the horizontal portions of the first precursor film 401 (e.g. the first precursor film 401 over a top surface of the fins 52 and the first precursor film 401 over the substrate 50) forming the first dielectric material 503 than the quantity of the second element able to react with the first element on the vertical portions of the first precursor film 401 (e.g. the first precursor film 401 over vertical sidewalls of the fins 52) forming the second dielectric material 505. As such, the first dielectric material 503 contains a higher concentration of the second element than the concentration of the second element present in the second dielectric material 505.

In this embodiment of the first dielectric material 503 containing the higher concentration of the second element than the concentration of the second element present in the second dielectric material 505, the first dielectric material 503 has different material properties than the second dielectric material 505 (e.g. different densities, growth rate, etch rate, etc.). In an embodiment the first dielectric material 503 has a first density, the first density in a range of 2.8 g/cm$^3$ to 2.9 g/cm$^3$, and the second dielectric material 505 has a second density, the second density in the range of 2.5 g/cm$^3$ to 2.7 g/cm$^3$, such that the first density is greater than the second density. Further, the first dielectric material 503 has a first etch rate using a particular etchant (described further below with respect to FIG. 7) in the range of 1 Å/min to 5 Å/min, and the second dielectric material 505 has a second etch rate in the range of 5 Å/min to 50 Å/min, such that the first etch rate is lower than the second etch rate. However, any suitable densities and etch rates may be utilized.

In an embodiment where the first dielectric material 503 and the second dielectric material 505 comprise silicon nitride formed using the silicon-forming step of the first half-cycle step 403 and the nitrogen-forming step of the second half-cycle step 501 under the anisotropic plasma ALD process, the first dielectric material 503 comprises silicon nitride and the second dielectric material 505 also comprises silicon nitride. However, in this embodiment the concentration of nitrogen present in the first dielectric material 503 is greater than the concentration of nitrogen present in the second dielectric material 505. Hence, the differences in concentration are utilized in order to adjust the material properties of the first dielectric material 503 relative to the material properties of the second dielectric material 505.

However, while the first dielectric material 503 and the second dielectric material 505 may be silicon nitride as discussed above, the material used for the first dielectric material 503 and the second dielectric material 505 is not intended to be limited to silicon nitride. In other embodiments, the first dielectric material 503 may be silicon oxide, silicon carbide, combinations of these, or the like. Further, the principles discussed above with respect to the first half-cycle step 403 and the second half-cycle step 501 apply to embodiments where the first dielectric material 503 and the second dielectric material 505 comprise silicon oxide or silicon carbide, but the first dielectric material 503 contains a higher concentration of oxygen or carbon than the second dielectric material 505, respectively and similarly, therefore the first dielectric material 503 will have different material properties than the second dielectric material 505.

It should be noted that the precursors and parameters discussed with respect to both the silicon-forming step and the nitrogen-forming step utilized in the formation of the first dielectric material 503 and the second dielectric material 505 is merely one example of an embodiment, and other embodiments utilizing other precursors and parameters in the formation of the first dielectric material 503 and the second dielectric material 505 are fully intended to be included within the scope of this disclosure. The example precursors and parameter values, and other precursors and parameter values may further be used in combination and may be used in other embodiments. Further, the term material properties is intended to include, but is not limited to, physical properties, chemical properties, electrical properties, atomic properties, magnetic properties, mechanical properties, thermal properties, etc.

Optionally, in accordance with some embodiments, after the second half-cycle step 501 and after the first dielectric material 503 and the second dielectric material 505 have been formed, an inert gas treatment step may be utilized to further affect the material properties differentiating the first dielectric material 503 from the second dielectric material 505. In some embodiments an inert gas, such as argon or helium is introduced as a plasma after the second half-cycle step 501. The additional introduction of the plasma containing the inert gas after the second half-cycle step 501 modifies the material properties of the first dielectric material 503 and the second dielectric material 505 differentiating the material property differences between the first dielectric material 503 and the second dielectric material 505.

In still other embodiments, the inert gas treatment step may be used to modify the material properties of the first dielectric material 503 and the second dielectric material 505 without the use of the anisotropic plasma during the second half-cycle step 501. In this embodiment the inert gas treatment step occurs following the second half-cycle step 501 in which the ALD process does not occur under the anisotropic plasma and the differentiation in material properties between the first dielectric material 503 and the second dielectric material 505 is a result of the inert gas treatment step.

In FIG. 6, the first half-cycle step 403, which deposits the first precursor film 401, and the second half-cycle step 501 (and optionally the inert gas treatment step), which forms the first dielectric material 503 and the second dielectric material 505, may be performed one or more times as part of the first deposition process 601. In an embodiment where the first deposition process 601 comprises multiple iterations of the first half-cycle step 403 and the second half-cycle step 501 (and optionally the inert gas treatment step) a first iteration forms the first precursor film 401 on the fins 52 and the substrate 50 and forms the first dielectric material 503 on the horizontal surfaces and the second dielectric material on the vertical surfaces using the first precursor film 401 and subsequent iterations forms a new layer of the first precursor film 401 over the previously formed first dielectric material 503 and second dielectric material 505 and a new layer of the first dielectric material 503 is formed over the previously formed first dielectric material 503 and a new layer of the second dielectric material 505 is formed over the previously formed second dielectric material 505.

The resulting repetition of the first half-cycle step 403 and the second half-cycle step 501 (and optionally the inert gas treatment step) comprises the first deposition process 601. The first deposition process 601 forms a first top dielectric layer 603 comprising the first dielectric material 503, a first bottom dielectric layer 605 comprising the first dielectric material 503, and a first vertical dielectric layer 607 comprising the second dielectric material 505.

For every repetition of the first half-cycle step 403 and the second half-cycle step 501 (and optionally the inert gas treatment step) the horizontal area available for the formation of the first dielectric material 503 of the first bottom dielectric layer 605 decreases. In particular, during each iteration the horizontal buildup of the second dielectric material 505 from the previous repetition of the first half-cycle step 403 and the second half-cycle step 501 (and optionally the inert gas treatment step) expands further outwards from the fins 52 and reducing the horizontal surface available to form the first bottom dielectric layer 605. As such, this results in the first bottom dielectric layer 605 having a tapered profile.

In an embodiment, the first half-cycle step 403 and the second half-cycle step 501 (and optionally the inert gas treatment step) may be repeated such that the first top dielectric layer 603 and the first bottom dielectric layer 605 have a first thickness Th1, the first thickness Th1 in the range of 2 nm to 7 nm and the first vertical dielectric layer 607 has a second thickness Th2, the second thickness Th2 in the range of 1 nm to 3 nm.

Figure 7:
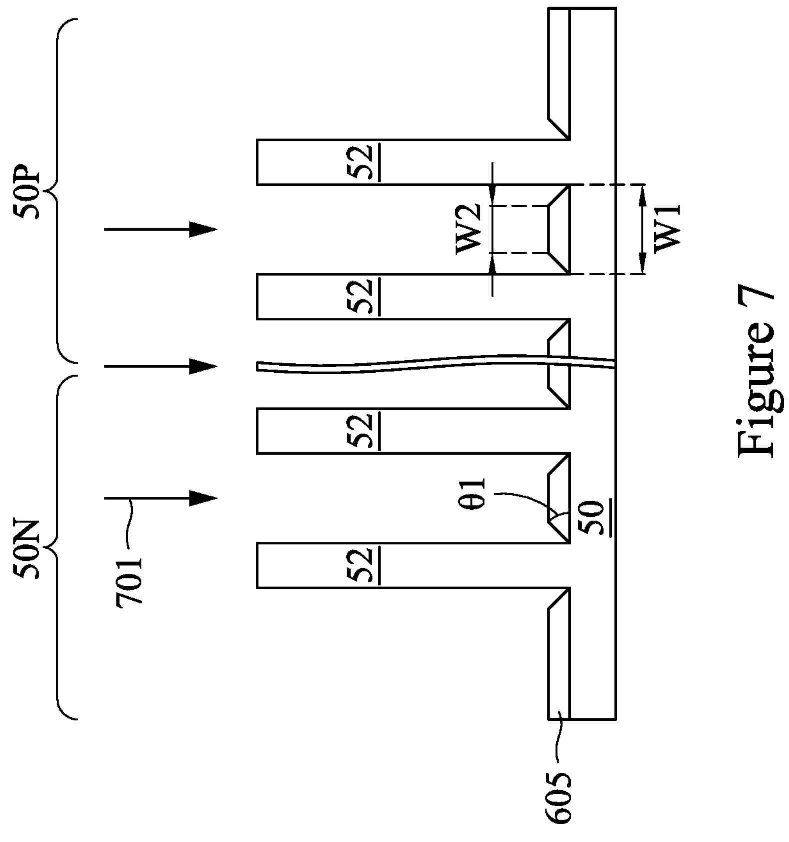

In FIG. 7, the second dielectric material 505 of the first vertical dielectric layer 607 is removed by a first etching process 701. In accordance with some embodiments the first etching process 701 utilizes a first etchant that more readily removes the second dielectric material 505 than the first dielectric material 503 due to the differences in material properties between the first dielectric material 503 and the second dielectric material 505. In an embodiment, the first etching process 701 removes the second dielectric material 505 of the first vertical dielectric layer 607 while leaving the first dielectric material 503 substantially intact. In some embodiments, the first etching process 701 may be a wet etch using an etchant such as dilute HF, a dry etch, a dry/wet etch integration, the like, or a combination thereof. However, any suitable etching process and any suitable etchant may be utilized for the first etching process 701.

Further, in accordance with some embodiments, the first top dielectric layer 603 is also removed either before or after the removal of the second dielectric material 505. The first top dielectric layer 603 may be removed utilizing a protection layer (not separately illustrated) and a planarization process. The protection layer is formed in between the neighboring fins 52 over the first bottom dielectric layer 605 (and in some embodiments, over the first top dielectric layer 603 as well). In some embodiments the protection layer may be formed of a polymer, spin-on carbon, spin-on carbon with at least one O—H group, or the like and may be formed by spin-on coating, flowable chemical vapor deposition, or the like. However, any suitable material and formation process for forming the protection layer may be utilized. In an embodiment where the protection layer covers the first top dielectric layer 603 a first planarization process may be performed to expose the first top dielectric layer 603. The first planarization process may be a chemical-mechanical polish (CMP) process, however, any suitable planarization process may be utilized for the first planarization process. Following the formation of the protection layer the first top dielectric layer 603 may be removed by a second planarization process, an etch process (since the first top dielectric layer 603 is now exposed), combinations of these, or the like. The second planarization process may be a CMP process, however, any suitable planarization process may be utilized for the second planarization process. Following the removal of the first top dielectric layer 603 the protection layer is removed. The protection layer may be removed by any suitable method such as an etching process, an ashing process, etc.

In some embodiments, the first top dielectric layer 603 is removed before the first vertical dielectric layer 607 is removed. In some embodiments, the first top dielectric layer 603 is removed after the first vertical dielectric layer 607 has been removed.

Following the removal of both the first top dielectric layer 603 and the first vertical dielectric layer 607 the first bottom dielectric layer 605 is present over the second top surface of the substrate 50 between neighboring fins 52. In some embodiments, the remaining first bottom dielectric layer 605 has a first bottom surface with a first width W1, the first width W1 in the range of 10 nm to 80 nm and has a third top surface with a second width W2, the second width W2 in the range of 8 nm to 78 nm, such that the first width W1 is greater than the second width W2. In an embodiment the first width W1 is equal to the first distance D1. In an embodiment where the first bottom dielectric layer 605 has the tapered profile, the tapered profile may have a first profile angle θ1 between the first bottom surface of the first bottom dielectric layer 605 and the side surface of the first bottom dielectric layer 605, the first profile angle θ1 in the range of 35 degrees to 50 degrees.

Figure 8:
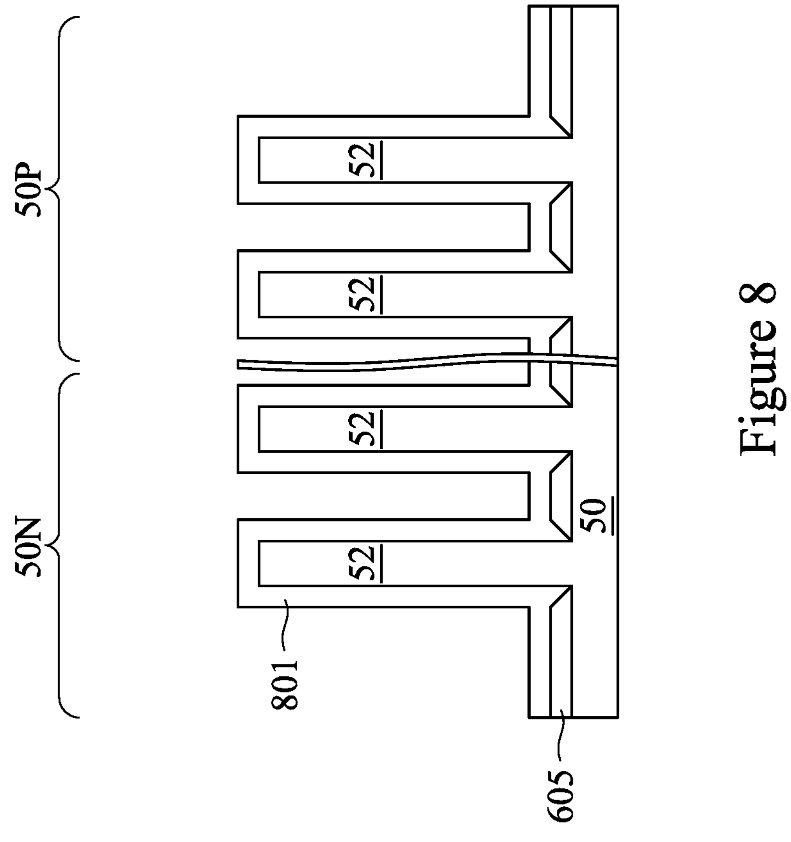

In FIG. 8, a third dielectric material 801 is formed on exposed surfaces of the fins 52 (e.g. vertical sidewalls of the fins 52 and the first top surface of the fins 52) as well as over the first bottom dielectric layer 605 following the removal of the first top dielectric layer 603 and the first vertical dielectric layer 607. In some embodiments, the third dielectric material 801 may be silicon nitride, silicon oxide, silicon carbide, or the like. In some embodiments, the third dielectric material 801 has similar density but slightly higher etch rate than the first dielectric material 503. In accordance with some embodiments the third dielectric material 801 may be deposited by an ALD process or a CVD process to a thickness of between in the range of 2 nm to 5 nm. However, any suitable deposition process and any suitable thickness may be utilized.

Figure 9:
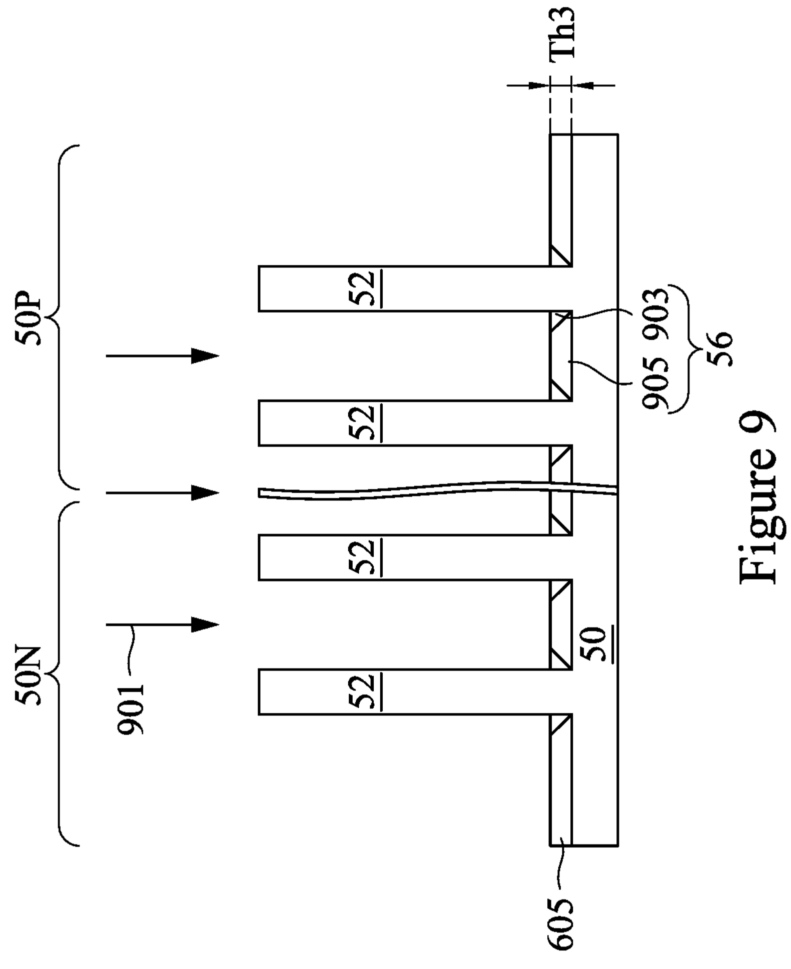

In FIG. 9, a first portion of the third dielectric material 801 and a second portion of the first dielectric material 503 of the first bottom dielectric layer 605 are removed. In accordance with some embodiments, the first portion of the third dielectric material 801 and the second portion of the first dielectric material 503 are removed by a second etching process 901 utilizing a second etchant. The second etching process 901 may be a dry etch (e.g. a radical dry etch), a wet etch (e.g. a dHF wet etch), a dry/wet etch integration, an isotropic etch, the like, or a combination thereof. However, any suitable etching process and any suitable etchant may be utilized for the second etching process 901. Following the second etching process 901 a third portion 903 of the third dielectric material 801 and a fourth portion 905 of the first dielectric material 503 remains over the second top surface of the substrate 50 in between neighboring fins 52. In some embodiments, the third portion 903 of the third dielectric material 801 and the fourth portion 905 of the first dielectric material 503 forms the isolation regions 56.

In an embodiment where the third dielectric material 801 has a similar density but slightly higher etch rate than the first dielectric material 503, following the second etching process 901 the isolation regions 56 have a flat profile. In some embodiments, the flat profile of the isolation regions 56 has a third thickness Th3, wherein the third thickness Th3 is in the range of 1 nm to 5 nm. However, any suitable thickness may be utilized.

Additionally, the process described with respect to FIGS. 2 through 9 is just one example of how the fins 52 and isolation regions 56 may be formed. In some embodiments, the fins 52 may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form the fins 52. Additionally, in some embodiments, heteroepitaxial structures can be used for the fins 52. For example, the fins 52 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in region 50N (e.g., an NMOS region) different from the material in region 50P (e.g., a PMOS region). In various embodiments, upper portions of the fins 52 may be formed from silicon germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Further in FIG. 9, appropriate wells (not shown) may be formed in the fins 52 and/or the substrate 50. In some embodiments, a P well may be formed in the region 50N, and an N well may be formed in the region 50P. In some embodiments, a P well or an N well are formed in both the region 50N and the region 50P.

In the embodiments with different well types, the different implant steps for the region 50N and the region 50P may be achieved using a photoresist or other masks (not shown). For example, a photoresist may be formed over the fins 52 and the STI regions 56 in the region 50N. The photoresist is patterned to expose the region 50P of the substrate 50, such as a PMOS region. The photoresist can be formed by using a spin-on technique and can be patterned using acceptable photolithography techniques. Once the photoresist is patterned, an n-type impurity implant is performed in the region 50P, and the photoresist may act as a mask to substantially prevent n-type impurities from being implanted into the region 50N, such as an NMOS region. The n-type impurities may be phosphorus, arsenic, antimony, or the like implanted in the region to a concentration of equal to or less than $10^{18}$ $cm^{-3}$, such as between about $10^{17}$ $cm^{-3}$ and about $10^{18}$ $cm^{-3}$. After the implant, the photoresist is removed, such as by an acceptable ashing process.

Following the implanting of the region 50P, a photoresist is formed over the fins 52 and the STI regions 56 in the region 50P. The photoresist is patterned to expose the region 50N of the substrate 50, such as the NMOS region. The photoresist can be formed by using a spin-on technique and can be patterned using acceptable photolithography techniques. Once the photoresist is patterned, a p-type impurity implant may be performed in the region 50N, and the photoresist may act as a mask to substantially prevent p-type impurities from being implanted into the region 50P, such as the PMOS region. The p-type impurities may be boron, $BF_2$, indium, or the like implanted in the region to a concentration of equal to or less than $10^{18}$ $cm^{-3}$, such as between about $10^{17}$ $cm^{-3}$ and about $10^{18}$ $cm^{-3}$. After the implant, the photoresist may be removed, such as by an acceptable ashing process.

After the implants of the region 50N and the region 50P, an anneal may be performed to activate the p-type and/or n-type impurities that were implanted. In some embodiments, the grown materials of epitaxial fins may be in situ doped during growth, which may obviate the implantations, although in situ and implantation doping may be used together.

Figure 10:
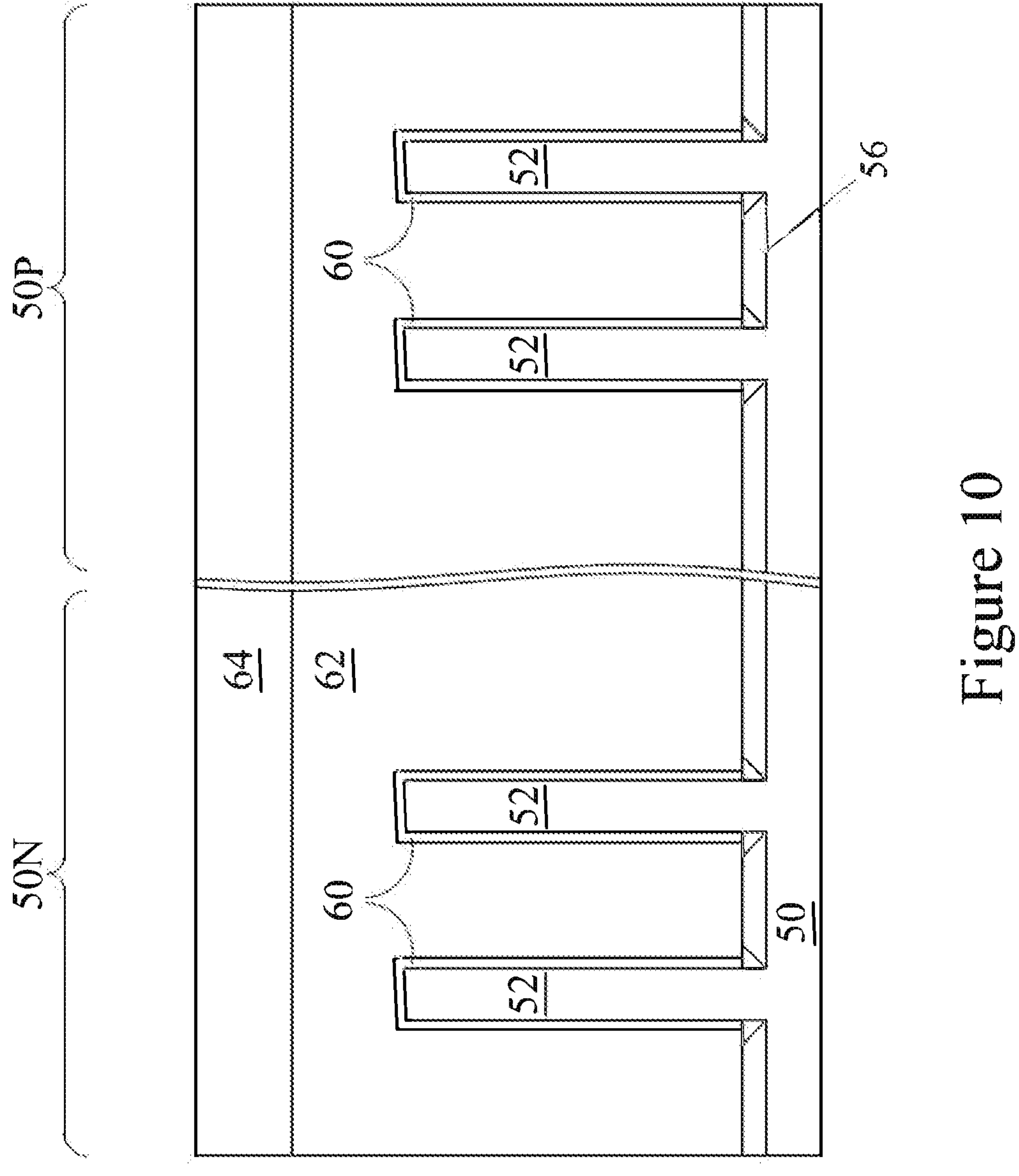
FIGS. 10, 11A, 11B, 12A, 12B, 13A, 13B, 13C, 13D, 14A, 14B, 15A, 15B, 16A, 16B, 17A, 17B, 17C, 18A, 18B, 19A, and 19B are cross-sectional views of intermediate stages in the manufacturing of FinFETs, in accordance with some embodiments.

In FIG. 10, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques known and used in the art for depositing conductive materials. The dummy gate layer 62 may be made of other materials that have a high etching selectivity from the etching of isolation regions. The mask layer 64 may include, for example, SiN, SiON, or the like. In this example, a single dummy gate layer 62 and a single mask layer 64 are formed across the region 50N and the region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending between the dummy gate layer 62 and the STI regions 56.

FIGS. 11A through 19B illustrate various additional steps in the manufacturing of embodiment devices. FIGS. 11A through 19B illustrate features in either of the region 50N and the region 50P. For example, the structures illustrated in FIGS. 11A through 19B may be applicable to both the region 50N and the region 50P. Differences (if any) in the structures of the region 50N and the region 50P are described in the text accompanying each figure.

Figure 11B:
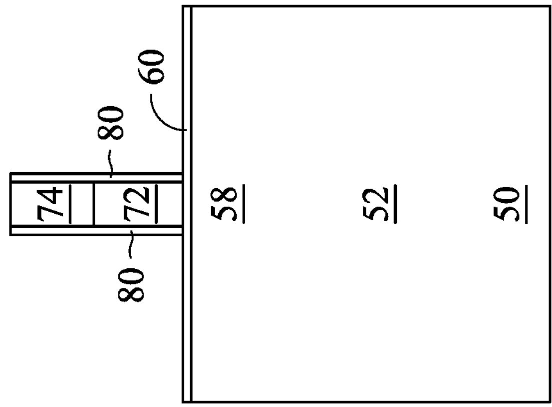
Figure 11A:
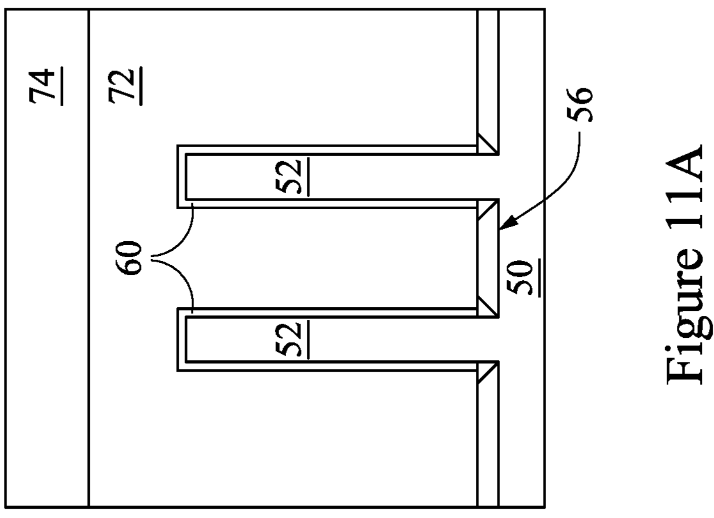

In FIGS. 11A and 11B, the mask layer 64 (see FIG. 10) may be patterned using acceptable photolithography and etching techniques to form masks 74. The pattern of the masks 74 then may be transferred to the dummy gate layer 62. In some embodiments (not illustrated), the pattern of the masks 74 may also be transferred to the dummy dielectric layer 60 by an acceptable etching technique to form dummy gates 72. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52.

Further in FIGS. 11A and 11B, gate seal spacers 80 can be formed on exposed surfaces of the dummy gates 72, the masks 74, and/or the fins 52. A thermal oxidation or a deposition followed by an anisotropic etch may form the gate seal spacers 80.

After the formation of the gate seal spacers 80, implants for lightly doped source/drain (LDD) regions (not explicitly illustrated) may be performed. In the embodiments with different device types, similar to the implants discussed above in FIG. 9, a mask, such as a photoresist, may be formed over the region 50N, while exposing the region 50P, and appropriate type (e.g., p-type) impurities may be implanted into the exposed fins 52 in the region 50P. The mask may then be removed. Subsequently, a mask, such as a photoresist, may be formed over the region 50P while exposing the region 50N, and appropriate type impurities (e.g., n-type) may be implanted into the exposed fins 52 in the region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ $cm^{-3}$ to about $10^{16}$ $cm^{-3}$. An anneal may be used to activate the implanted impurities.

Figure 12B:
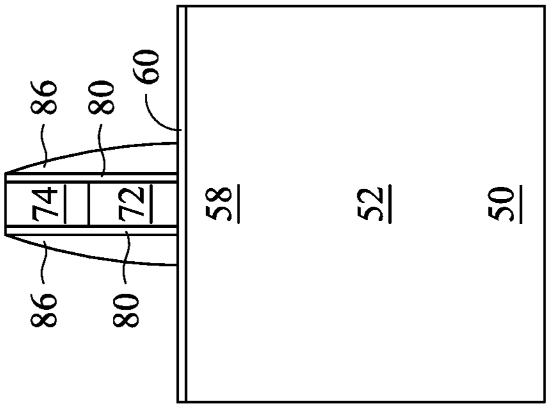
Figure 12A:
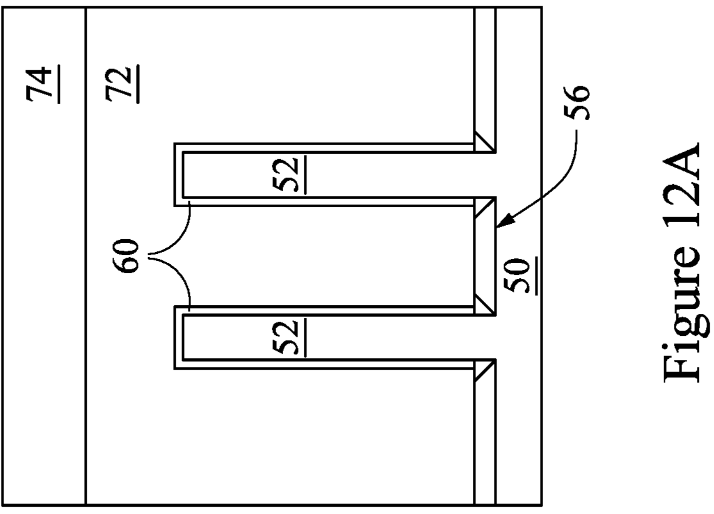

In FIGS. 12A and 12B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may be silicon nitride, SiCN, a combination thereof, or the like.

Figure 13B:
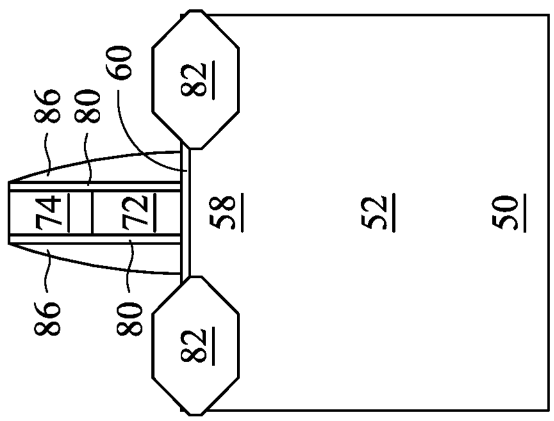
Figure 13A:
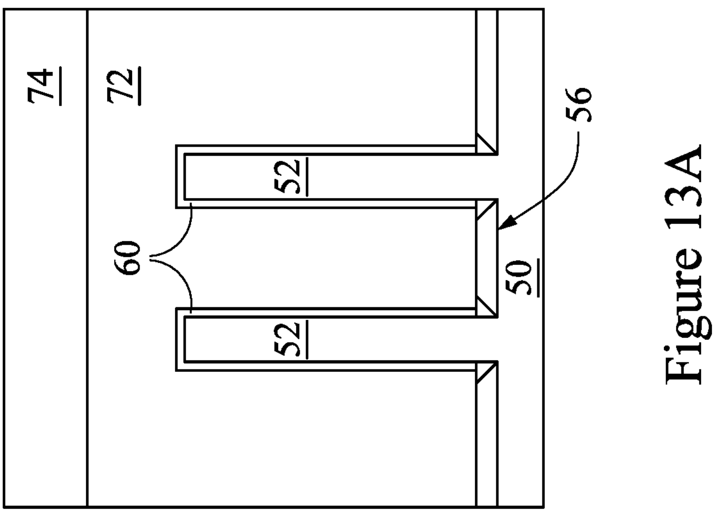
Figure 13D:
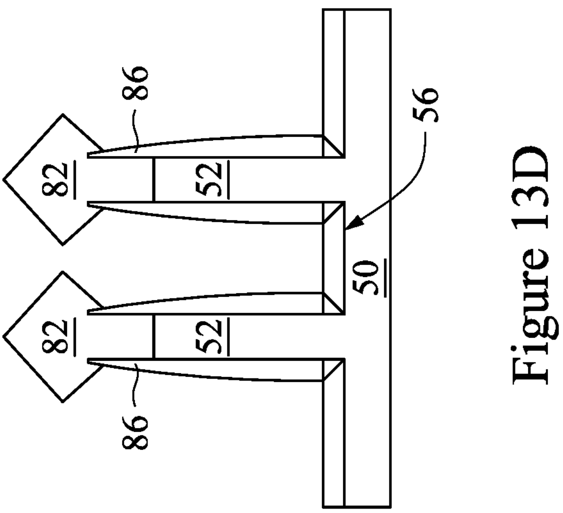
Figure 13C:
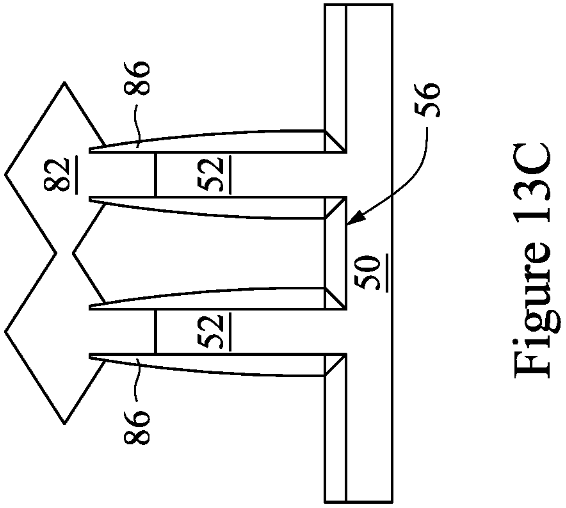

In FIGS. 13A and 13B epitaxial source/drain regions 82 are formed in the fins 52 to exert stress in the respective channel regions 58, thereby improving performance. The epitaxial source/drain regions 82 are formed in the fins 52 such that each dummy gate 72 is disposed between respective neighboring pairs of the epitaxial source/drain regions 82. In some embodiments the epitaxial source/drain regions 82 may extend into, and may also penetrate through, the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs 100.

The epitaxial source/drain regions 82 in the region 50N, e.g., the NMOS region, may be formed by masking the region 50P, e.g., the PMOS region, and etching source/drain regions of the fins 52 in the region 50N to form recesses in the fins 52. Then, the epitaxial source/drain regions 82 in the region 50N are epitaxially grown in the recesses. The epitaxial source/drain regions 82 may include any acceptable material, such as appropriate for n-type FinFETs. For example, if the fin 52 is silicon, the epitaxial source/drain regions 82 in the region 50N may include materials exerting a tensile strain in the channel region 58, such as silicon, SiC, SiCP, SiP, or the like. The epitaxial source/drain regions 82 in the region 50N may have surfaces raised from respective surfaces of the fins 52 and may have facets.

The epitaxial source/drain regions 82 in the region 50P, e.g., the PMOS region, may be formed by masking the region 50N, e.g., the NMOS region, and etching source/drain regions of the fins 52 in the region 50P are etched to form recesses in the fins 52. Then, the epitaxial source/drain regions 82 in the region 50P are epitaxially grown in the recesses. The epitaxial source/drain regions 82 may include any acceptable material, such as appropriate for p-type FinFETs. For example, if the fin 52 is silicon, the epitaxial source/drain regions 82 in the region 50P may comprise materials exerting a compressive strain in the channel region 58, such as SiGe, SiGeB, Ge, GeSn, or the like. The epitaxial source/drain regions 82 in the region 50P may also have surfaces raised from respective surfaces of the fins 52 and may have facets.

The epitaxial source/drain regions 82 and/or the fins 52 may be implanted with dopants to form source/drain regions, similar to the process previously discussed for forming lightly-doped source/drain regions, followed by an anneal. The source/drain regions may have an impurity concentration of between about $10^{19}$ $cm^{-3}$ and about $10^{21}$ $cm^{-3}$. The n-type and/or p-type impurities for source/drain regions may be any of the impurities previously discussed. In some embodiments, the epitaxial source/drain regions 82 may be in situ doped during growth.

As a result of the epitaxy processes used to form the epitaxial source/drain regions 82 in the region 50N and the region 50P, upper surfaces of the epitaxial source/drain regions have facets which expand laterally outward beyond sidewalls of the fins 52. In some embodiments, these facets cause adjacent source/drain regions 82 of a same FinFET 100 to merge as illustrated by FIG. 13C. In other embodiments, adjacent source/drain regions 82 remain separated after the epitaxy process is completed as illustrated by FIG. 13D.

Figure 14B:
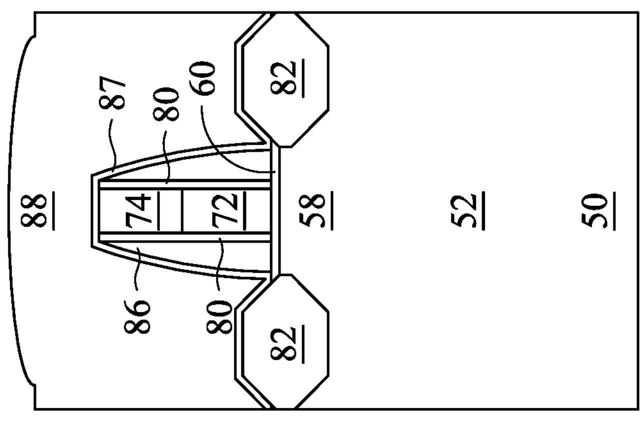
Figure 14A:
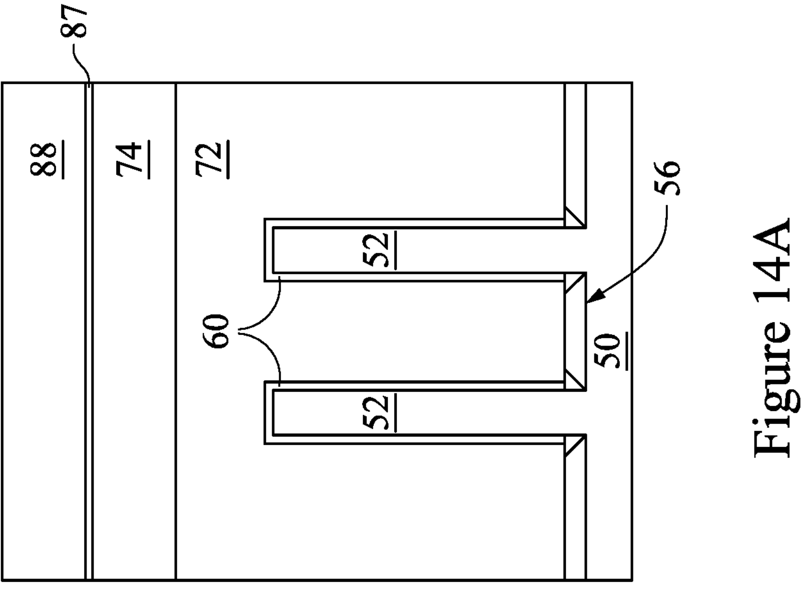

In FIGS. 14A and 14B, a first ILD 88 is deposited over the structure illustrated in FIGS. 13A and 13B. The first ILD 88 may be formed of a dielectric material, and may be deposited by any suitable method, such as CVD, plasma-enhanced CVD (PECVD), or FCVD. Dielectric materials may include Phospho-Silicate Glass (PSG), Boro-Silicate Glass (BSG), Boron-Doped Phospho-Silicate Glass (BPSG), undoped Silicate Glass (USG), or the like. Other insulation materials formed by any acceptable process may be used. In some embodiments, a contact etch stop layer (CESL) 87 is disposed between the first ILD 88 and the epitaxial source/drain regions 82, the masks 74, and the gate spacers 86. The CESL 87 may comprise a dielectric material, such as, silicon nitride, silicon oxide, silicon oxynitride, or the like, having a different etch rate than the material of the overlying first ILD 88.

Figures 15A, 15B:
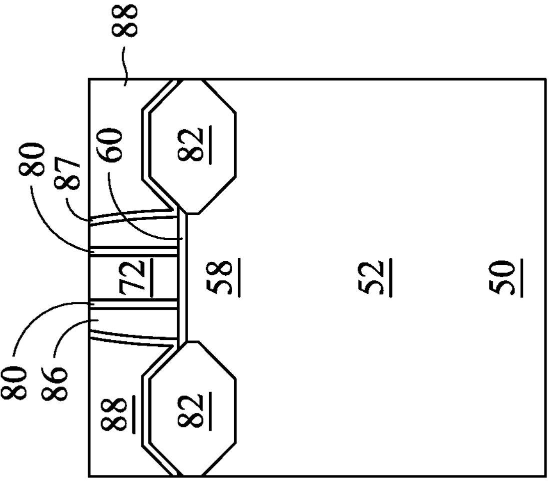

In FIGS. 15A and 15B, a planarization process, such as a CMP, may be performed to level the top surface of the first ILD 88 with the top surfaces of the dummy gates 72 or the masks 74. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level. Accordingly, the top surfaces of the dummy gates 72 are exposed through the first ILD 88. In some embodiments, the masks 74 may remain, in which case the planarization process levels the top surface of the first ILD 88 with the top surfaces of the masks 74.

Figure 16B:
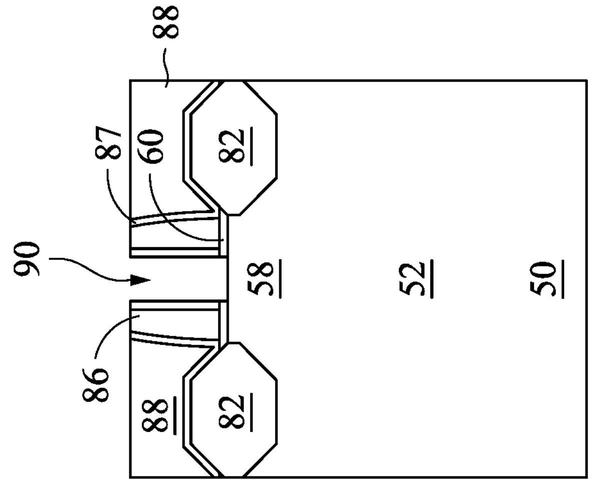
Figure 16A:
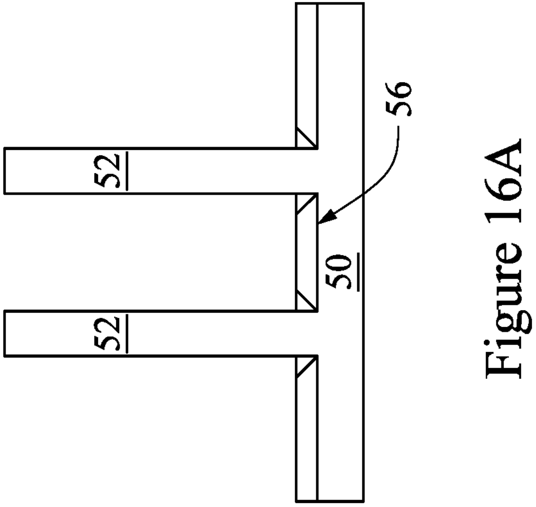

In FIGS. 16A and 16B, the dummy gates 72, and the masks 74 if present, are removed in an etching step(s), so that recesses 90 are formed. Portions of the dummy dielectric layer 60 in the recesses 90 may also be removed. In some embodiments, only the dummy gates 72 are removed and the dummy dielectric layer 60 remains and is exposed by the recesses 90. In some embodiments, the dummy dielectric layer 60 is removed from recesses 90 in a first region of a die (e.g., a core logic region) and remains in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 without etching the first ILD 88 or the gate spacers 86. Each recess 90 exposes a channel region 58 of a respective fin 52. Each channel region 58 is disposed between neighboring pairs of the epitaxial source/drain regions 82. During the removal, the dummy dielectric layer 60 may be used as an etch stop layer when the dummy gates 72 are etched. The dummy dielectric layer 60 may then be optionally removed after the removal of the dummy gates 72.

Figure 17B:
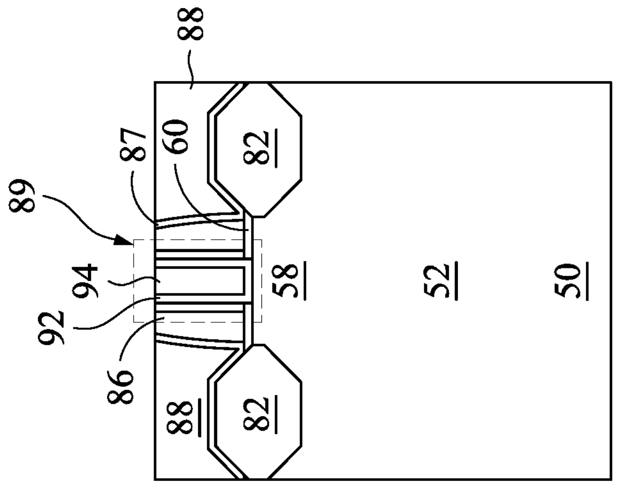
Figure 17A:
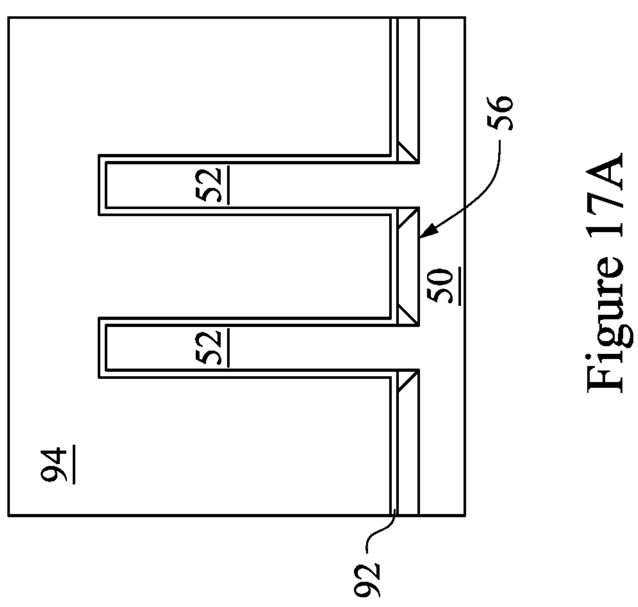
Figure 17C:
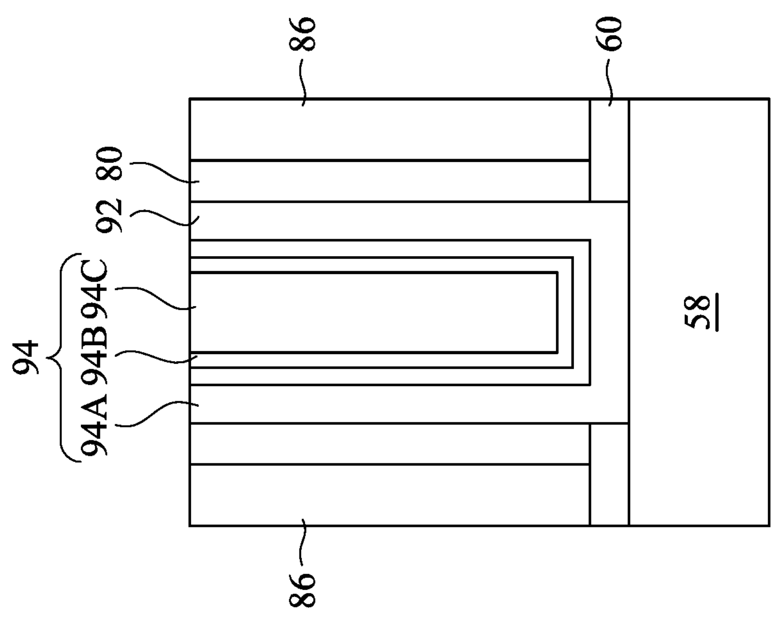

In FIGS. 17A and 17B, gate dielectric layers 92 and gate electrodes 94 are formed for replacement gates. FIG. 17C illustrates a detailed view of region 89 of FIG. 17B. Gate dielectric layers 92 are deposited conformally in the recesses 90, such as on the top surfaces and the sidewalls of the fins 52 and on sidewalls of the gate seal spacers 80/gate spacers 86. The gate dielectric layers 92 may also be formed on top surface of the first ILD 88. In accordance with some embodiments, the gate dielectric layers 92 comprise silicon oxide, silicon nitride, or multilayers thereof. In some embodiments, the gate dielectric layers 92 include a high-k dielectric material, and in these embodiments, the gate dielectric layers 92 may have a k value greater than about 7.0, and may include a metal oxide or a silicate of Hf, Al, Zr, La, Mg, Ba, Ti, Pb, and combinations thereof. The formation methods of the gate dielectric layers 92 may include Molecular-Beam Deposition (MBD), ALD, PECVD, and the like. In embodiments where portions of the dummy dielectric layer 60 remains in the recesses 90, the gate dielectric layers 92 include a material of the dummy dielectric layer 60 (e.g., $SiO_2$).

The gate electrodes 94 are deposited over the gate dielectric layers 92, respectively, and fill the remaining portions of the recesses 90. The gate electrodes 94 may include a metal-containing material such as TiN, TiO, TaN, TaC, Co, Ru, Al, W, combinations thereof, or multi-layers thereof. For example, although a single layer gate electrode 94 is illustrated in FIG. 17B, the gate electrode 94 may comprise any number of liner layers 94A, any number of work function tuning layers 94B, and a fill material 94C as illustrated by FIG. 17C. After the filling of the gate electrodes 94, a planarization process, such as a CMP, may be performed to remove the excess portions of the gate dielectric layers 92 and the material of the gate electrodes 94, which excess portions are over the top surface of the first ILD 88. The remaining portions of material of the gate electrodes 94 and the gate dielectric layers 92 thus form replacement gates of the resulting FinFETs 100. The gate electrodes 94 and the gate dielectric layers 92 may be collectively referred to as a "gate stack." The gate and the gate stacks may extend along sidewalls of a channel region 58 of the fins 52.

The formation of the gate dielectric layers 92 in the region 50N and the region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

Figure 18B:
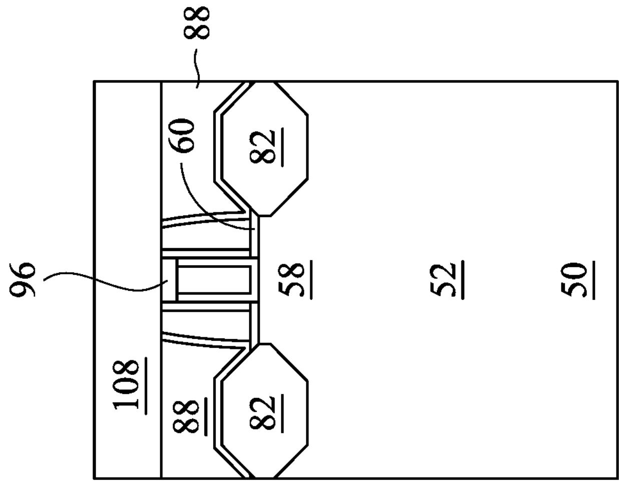
Figure 18A:
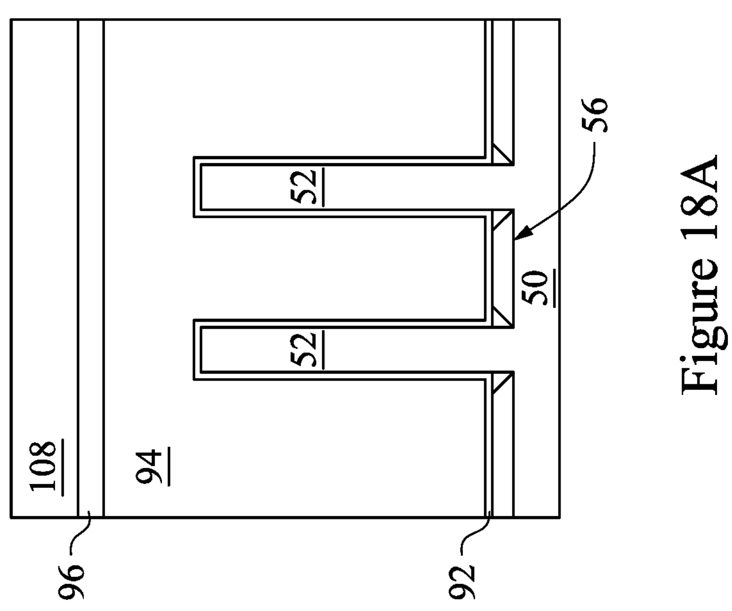

In FIGS. 18A and 18B, a second ILD 108 is deposited over the first ILD 88. In some embodiments, the second ILD 108 is a flowable film formed by a flowable CVD method. In some embodiments, the second ILD 108 is formed of a dielectric material such as PSG, BSG, BPSG, USG, or the like, and may be deposited by any suitable method, such as CVD and PECVD. In accordance with some embodiments, before the formation of the second ILD 108, the gate stack (including a gate dielectric layer 92 and a corresponding overlying gate electrode 94) is recessed, so that a recess is formed directly over the gate stack and between opposing portions of gate spacers 86, as illustrated in FIGS. 18A and 18B. A gate mask 96 comprising one or more layers of dielectric material, such as silicon nitride, silicon oxynitride, or the like, is filled in the recess, followed by a planarization process to remove excess portions of the dielectric material extending over the first ILD 88. The subsequently formed gate contacts 110 (FIGS. 19A and 19B) penetrate through the gate mask 96 to contact the top surface of the recessed gate electrode 94.

Figure 19B:
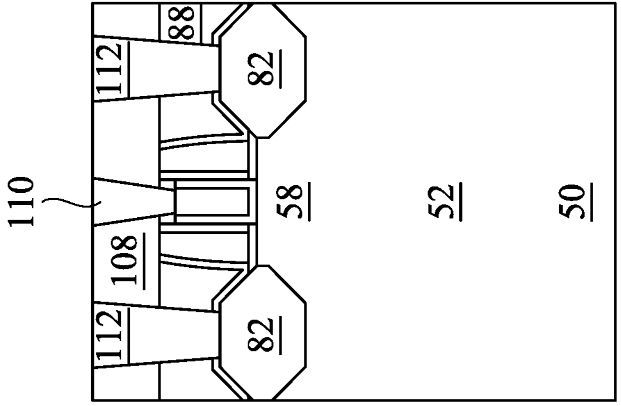
Figure 19A:
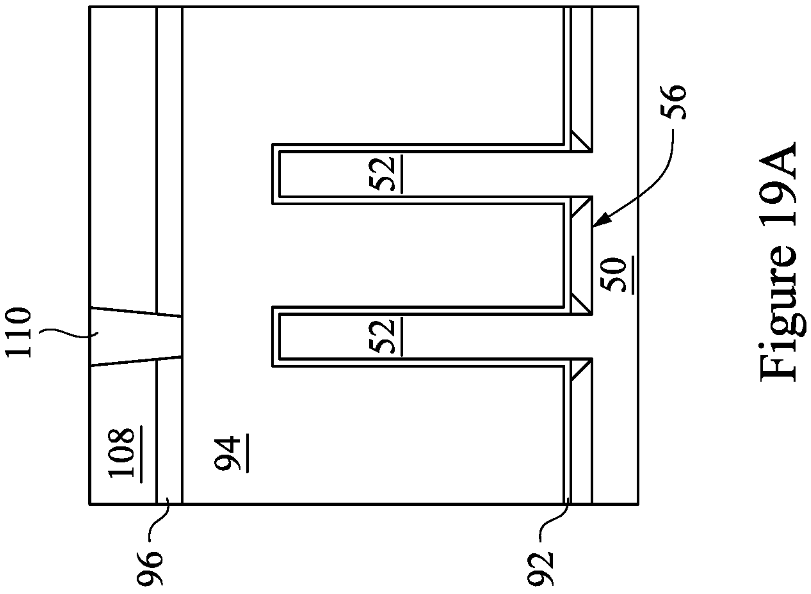

In FIGS. 19A and 19B, gate contacts 110 and source/drain contacts 112 are formed through the second ILD 108 and the first ILD 88 in accordance with some embodiments. Openings for the source/drain contacts 112 are formed through the first ILDs 88 and second ILDs 108, and openings for the gate contact 110 are formed through the second ILD 108 and the gate mask 96. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 108. The remaining liner and conductive material form the source/drain contacts 112 and gate contacts 110 in the openings. An anneal process may be performed to form a silicide at the interface between the epitaxial source/drain regions 82 and the source/drain contacts 112. The source/drain contacts 112 are physically and electrically coupled to the epitaxial source/drain regions 82, and the gate contacts 110 are physically and electrically coupled to the gate electrodes 94. The source/drain contacts 112 and gate contacts 110 may be formed in different processes, or may be formed in the same process. Although shown as being formed in the same cross-sections, it should be appreciated that each of the source/drain contacts 112 and gate contacts 110 may be formed in different cross-sections, which may avoid shorting of the contacts.

Advantages of the present embodiments include the ability to form isolation regions 56 with finely tuned geometric profiles by utilizing the differences in material properties (e.g. density, etch rate, etc.) between dielectric materials (e.g. the first dielectric material 503, the second dielectric material 505, and the third dielectric material 801) deposited using such processes such as an ALD process or CVD process to better control the etching processes (e.g. the first etching process 701 and the second etching process 901) used to form the isolation regions 56 in situations with requiring the formation of isolation regions in high aspect ratio regions such as between the fins 52 with small openings such as the first distance D1 between the fins 52.

Figure 20B:
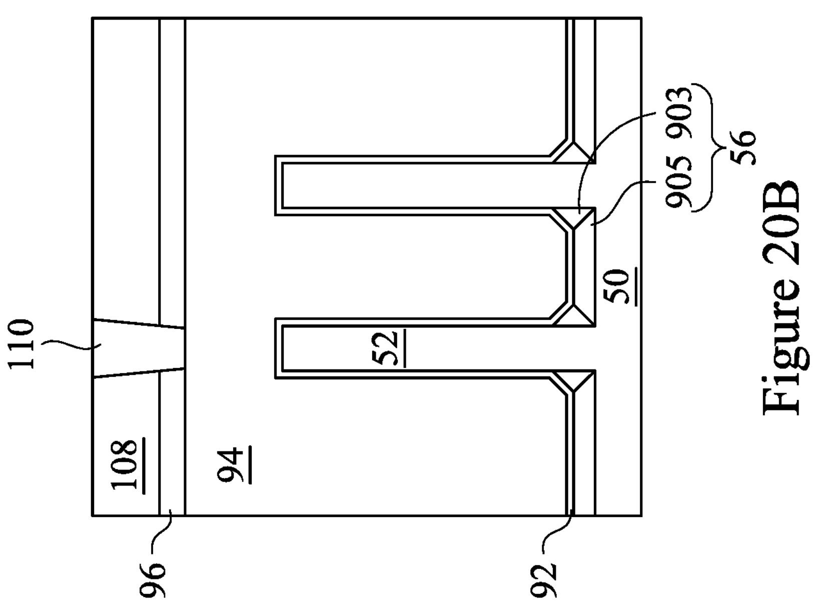
FIGS. 20A and 20B illustrate an example of the trench isolation structure having a concave profile, in accordance with some embodiments.
Figure 20A:
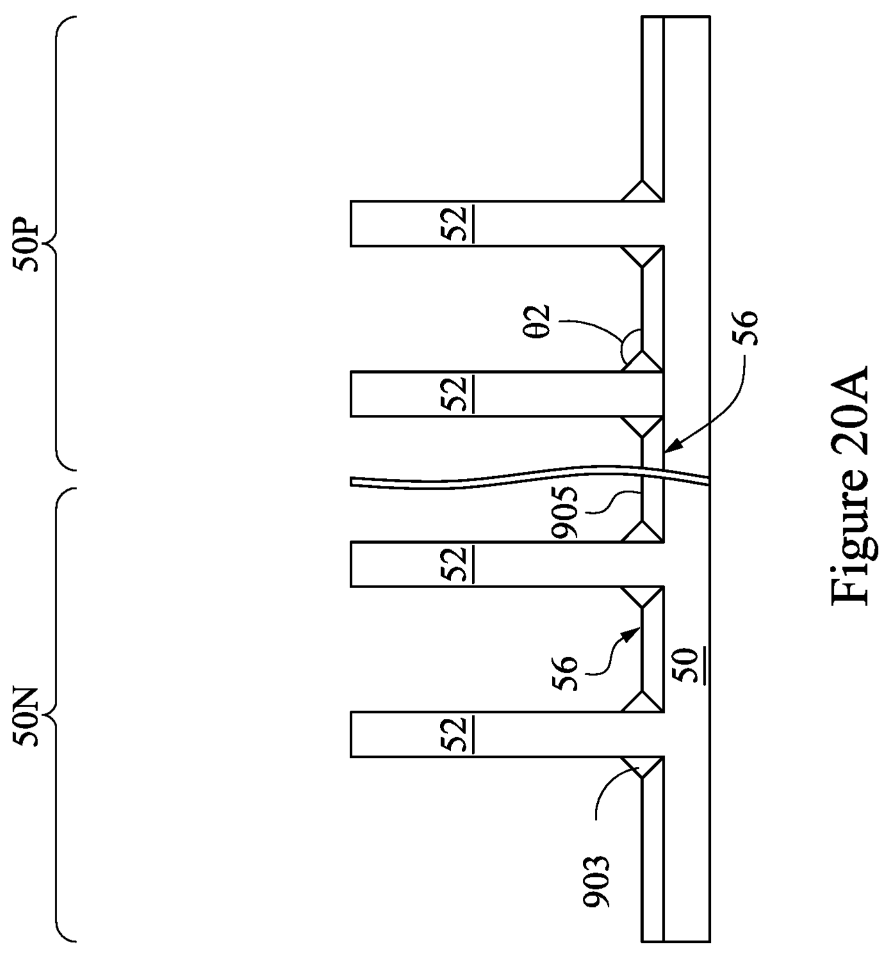

FIGS. 20A and 20B illustrate another embodiment in which the third portion 903 of the third dielectric material 801 and the fourth portion 905 of the first dielectric material 503 form the isolation regions 56 in a similar manner as discussed above except the third dielectric material 801 has different material properties than the first dielectric material 503. The selection of the third dielectric material 801 and the first dielectric material 503 based on differences in material properties between the third dielectric material 801 and the first dielectric material 503 allows for the tuning of a profile geometry of the isolation regions 56.

In some embodiments, the third dielectric material 801 may be a dielectric material such as silicon nitride, for example, while the first dielectric material 503 may also be silicon nitride, for example, but having a different concentration of nitrogen than the third dielectric material 801 resulting in the differences in material properties between the third dielectric material 801 and the first dielectric material 503 allowing for the tuning of the profile geometry of the isolation regions 56. In some embodiments, the third dielectric material 801 may be a dielectric material such as silicon oxide, for example, while the first dielectric material is silicon nitride, for example, the different compounds having different material properties allowing for the tuning of the profile geometry of the isolation regions 56.

In FIG. 20A, the isolation regions 56 are depicted as having a concave profile. In an embodiment where the third dielectric material 801 has a higher density than the density of the first dielectric material 503 and the third dielectric material 801 has a lower etch rate than the first dielectric material 503 the second etching process 901 removes the first dielectric material 503 more readily than the third dielectric material 801 resulting in the third portion 903 of the third dielectric material 801 and the fourth portion 905 of the first dielectric material 503 forming the isolation regions 56 having a concave profile. In this embodiment, the third dielectric material 801 may have a density in the range of 2.7 $g/cm^3$ to 3.0 $g/cm^3$ and may have an etch rate in the range of 1 Å/min to 5 Å/min. In this embodiment, the isolation regions 56 may have a second profile angle θ2 between a fourth top surface of the third portion 903 of the third dielectric material 801 and a fifth top surface of the fourth portion 905 of the first dielectric material 503. The second profile angle θ2 in the range of 130 degrees to 145 degrees.

In FIG. 20B, a cross-section of the resulting FinFETs 100 formed as discussed with respect to FIG. 19A is depicted with the exception of the isolation regions 56 having the concave profile as discussed with respect to FIG. 20A. As such, the profile geometry of the isolation regions 56 is directly related to the material properties of the first dielectric material 503, the third dielectric material 801, and the parameters of the second etching process 901.

Figure 21B:
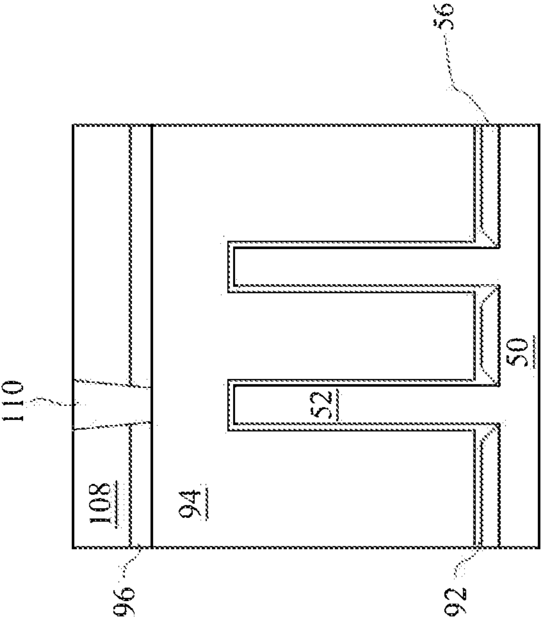
FIGS. 21A and 21B illustrate an example of the trench isolation structure having a convex profile, in accordance with some embodiments.
Figure 21A:
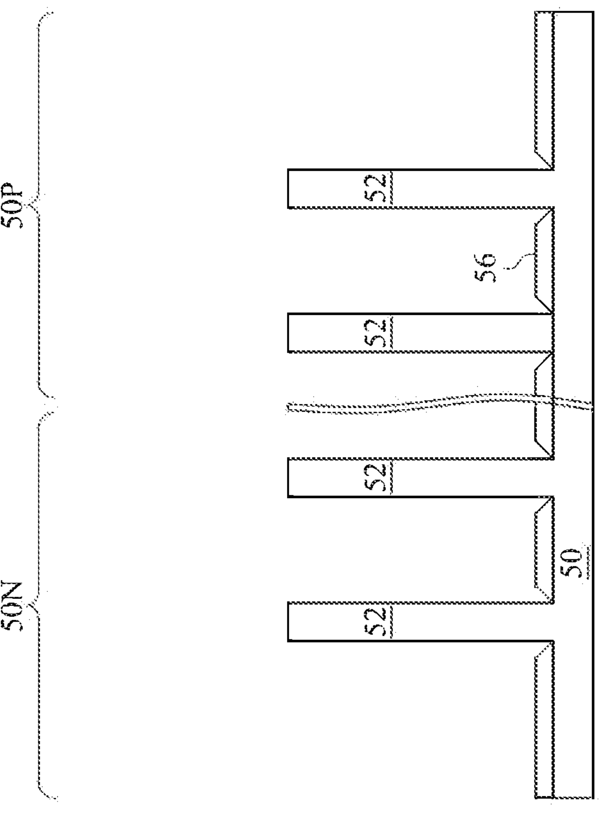

In FIGS. 21A and 21B cross-sectional views of various stages of forming the FinFET 100 are depicted in an embodiment in which the isolation regions 56 have a convex profile. FIG. 21A depicts the formation of the isolation regions 56 as formed in a similar manner as discussed above with respect to FIGS. 2 through 9 with the exception that in this embodiment the formation of the third dielectric material 801 and subsequent second etching process 901 may be omitted. In this embodiment, the isolation regions 56 have the convex profile as produced from the repetition of the first half-cycle step 403 and the second half-cycle step 501 (and optionally the inert gas treatment step). In this embodiment, the convex profile may have the first profile angle θ1. In this embodiment, the convex profile may have the first thickness Th1, the first bottom surface with the first width W1, and the third top surface with the second width W2, where the first width W1 is equal to the first distance D1. FIG. 21B depicts a cross-section of the resulting FinFETs 100 formed as discussed with respect to FIG. 19A with the exception of the isolation regions 56 having the convex profile as discussed with respect to FIG. 21A.

The disclosed FinFET embodiments could also be applied to gate-all-around (GAA) device as such as nanostructure (e.g., nanosheet, nanowire, or the like) field effect transistors (NSFETs). In an NSFET embodiment, the fins are replaced by nanostructures formed by patterning a stack of alternating layers of channel layers and sacrificial layers. Dummy gate stacks and source/drain regions are formed in a manner similar to the above-described embodiments. After the dummy gate stacks are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments. A nanostructure device can be formed as disclosed in U.S. Pat. No. 9,647,071, which is incorporated herein by reference in its entirety.

The embodiments discussed herein provide advantages by utilizing the different material properties of various dielectric materials to shape the isolation regions 56 to have a desired profile geometry. By forming the first precursor film 401 into the first dielectric material 503 and the second dielectric material 505, the first dielectric material 503 having different material properties than the second dielectric material 505, the first etching process 701 may remove the second dielectric material 505 while leaving a substantial portion of the first dielectric material 503 intact. The remaining first dielectric material 503 forming the basis for the isolation regions 56, the isolation regions 56 having the convex profile. The convex profile of the isolation regions 56 can further be modified to have the flat profile or concave profile as desired by adding and etching the third dielectric material 801, the material properties of the third dielectric material 801 being directly related to the geometric profile of the isolation regions 56 following the second etching process 901.

In accordance with some embodiments of the present disclosure a method of forming a semiconductor device includes: forming a fin over a semiconductor substrate; forming a precursor film over the fin and the semiconductor substrate; treating the precursor film, wherein the treating the precursor film forms a first dielectric material from a first portion of the precursor film and forms a second dielectric material from a second portion of the precursor film, wherein the first dielectric material has a first density and the second dielectric material has a second density, the first density being different from the second density; and removing the second dielectric material, wherein after the removing the second dielectric material an isolation structure is formed comprising the first dielectric material over the semiconductor substrate and adjacent to the fin. In an embodiment after the removing the second dielectric material the isolation structure has a convex profile. In an embodiment the convex profile has a first profile angle, the first profile angle in a range of 35 degrees to 50 degrees. In an embodiment further including: forming a third dielectric material over the fin, the semiconductor substrate, and the first dielectric material after the removing the second dielectric material; and performing an etching process on the first dielectric material and the third dielectric material. In an embodiment following the etching process the isolation structure has a flat profile. In an embodiment following the etching process the isolation structure has a concave profile. In an embodiment following the etching process the concave profile has a second profile angle, the second profile angle in a range of 130 degrees to 145 degrees.

In accordance with some embodiments of the present disclosure a semiconductor device includes: a first fin over a semiconductor substrate; and a first dielectric material over the semiconductor substrate adjacent to the first fin, the first dielectric material having a convex profile with a tapered angle, the tapered angle in a range of 35 degrees to 50 degrees, the first dielectric material having a width that gets smaller as the first dielectric material extends away from the semiconductor substrate. In an embodiment the first dielectric material includes silicon nitride, silicon oxide, or silicon carbide. In an embodiment the first dielectric material has a thickness, the thickness in a range of 1 nm to 5 nm. In an embodiment the first dielectric material has a density, the density in the range of 2.8 g/cm$^3$ to 2.9 g/cm$^3$. In an embodiment the tapered angle is located at an intersection between the first fin and the semiconductor substrate. In an embodiment further including a second fin over the semiconductor substrate, the second fin being a distance away from the first fin and the first dielectric material having a bottom width, the bottom width equal to the distance. In an embodiment further including a second dielectric material over the tapered angle of the first dielectric material, the second dielectric material having different material properties than the first dielectric material.

In accordance with some embodiments of the present disclosure a method of forming a semiconductor device includes: forming a first semiconductor fin over a substrate; depositing a layer of silicon over the first semiconductor fin and over the substrate adjacent to the first semiconductor fin; applying an anisotropic plasma to the layer of silicon with an element, wherein the applying the anisotropic plasma forms a first dielectric material from horizontal portions of the layer of silicon and forms a second dielectric material from vertical portions of the layer of silicon, the first dielectric material having a first concentration of the element and the second dielectric material having a second concentration of the element, the first concentration being different from than the second concentration; and performing an etching process to remove the second dielectric material. In an embodiment further including removing the first dielectric material formed on a first top surface of the first semiconductor fin. In an embodiment further including forming a second semiconductor fin over the substrate adjacent to the first semiconductor fin, wherein the second semiconductor fin is a distance away from the first semiconductor fin, the distance being equal to a first width of a bottom surface of the second dielectric material. In an embodiment the first dielectric material has a second top surface with a second width, the first width being greater than the second width. In an embodiment the second dielectric material comprises silicon nitride and has a first density, the first density in the range of 2.5 g/cm$^3$ to 2.7 g/cm$^3$. In an embodiment the first dielectric material comprises silicon nitride and has a second density, the second density in the range of 2.8 g/cm$^3$ to 2.9 g/cm$^3$.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device comprising:

forming a fin over a semiconductor substrate;

forming a precursor film over the fin and the semiconductor substrate;

treating the precursor film with an anisotropic plasma process, wherein the anisotropic plasma process introduces an element to the precursor film, wherein the treating the precursor film forms a first dielectric material from a first portion of the precursor film and forms a second dielectric material from a second portion of the precursor film, wherein the first dielectric material has a first density of the element and the second dielectric material has a second density of the element, the first density being different from the second density, wherein the first dielectric material has a different concentration of the element than the second dielectric material; and removing the second dielectric material, wherein after the removing the second dielectric material an isolation structure is formed comprising the first dielectric material over the semiconductor substrate and adjacent to the fin.

2. The method of claim 1, wherein after the removing the second dielectric material the isolation structure has a convex profile.

3. The method of claim 2, wherein the convex profile has a first profile angle, the first profile angle being in a range of 35 degrees to 50 degrees.

4. The method of claim 1, further comprising:
forming a third dielectric material over the fin, the semiconductor substrate, and the first dielectric material after the removing the second dielectric material; and
performing an etching process on the first dielectric material and the third dielectric material.

5. The method of claim 4, wherein following the etching process the isolation structure has a flat profile.

6. The method of claim 4, wherein following the etching process the isolation structure has a concave profile.

7. The method of claim 6, wherein following the etching process the concave profile has a second profile angle, the second profile angle being in a range of 130 degrees to 145 degrees.

8. A method of forming a semiconductor device comprising:
forming a first semiconductor fin over a substrate;
depositing a layer of silicon over the first semiconductor fin and over the substrate adjacent to the first semiconductor fin;
applying an anisotropic plasma to the layer of silicon with an element, wherein the applying the anisotropic plasma forms a first dielectric material from horizontal portions of the layer of silicon and forms a second dielectric material from vertical portions of the layer of silicon, the first dielectric material having a first concentration of the element and the second dielectric material having a second concentration of the element, the first concentration being different from the second concentration; and
performing an etching process to remove the second dielectric material.

9. The method of claim 8, further comprising removing the first dielectric material formed on a first top surface of the first semiconductor fin.

10. The method of claim 9, further comprising forming a second semiconductor fin over the substrate adjacent to the first semiconductor fin, wherein a first portion of the first dielectric material extends between the first semiconductor fin and the second semiconductor fin, wherein the second semiconductor fin is a distance away from the first semiconductor fin, the distance being equal to a first width of a bottom surface of the first portion of the first dielectric material.

11. The method of claim 10, wherein the first dielectric material has a second top surface with a second width, the first width being greater than the second width.

12. The method of claim 8, wherein the second dielectric material comprises silicon nitride and has a first density, the first density of the second dielectric material being in a range of 2.5 $g/cm^3$ to 2.7 $g/cm^3$.

13. The method of claim 12, wherein the first dielectric material comprises silicon nitride and has a second density, the second density of the first dielectric material being in a range of 2.8 $g/cm^3$ to 2.9 $g/cm^3$.

14. A method of forming a semiconductor device comprising:
forming a first semiconductor fin and a second semiconductor fin over a substrate;
forming a first dielectric layer over an upper surface of the first semiconductor fin, an upper surface of the second semiconductor fin, and an upper surface of the substrate between the first semiconductor fin and the second semiconductor fin, and forming a second dielectric layer over sidewalls of the first semiconductor fin and over sidewalls of the second semiconductor fin, wherein the first dielectric layer has a different material composition than the second dielectric layer, wherein forming the first dielectric layer and forming the second dielectric layer comprises:
depositing a first sub-layer over the first semiconductor fin, over the second semiconductor fin, and over the substrate adjacent to the first semiconductor fin; and
applying an anisotropic plasma process to the first sub-layer with an element, wherein the applying the anisotropic plasma process forms the first dielectric layer of a first dielectric material from horizontal portions of the first sub-layer and forms the second dielectric layer of a second dielectric material from vertical portions of the first sub-layer, the first dielectric material having a first concentration of the element and the second dielectric material having a second concentration of the element, the first concentration being different from the second concentration;
removing the second dielectric layer over the sidewalls of the first semiconductor fin and over sidewalls of the second semiconductor fin, wherein the first dielectric layer on the upper surface of the substrate between the first semiconductor fin and the second semiconductor fin remains after removing the second dielectric layer; and
forming a gate structure over the first semiconductor fin and the second semiconductor fin, wherein the gate structure extends over the first dielectric layer on the upper surface of the substrate between the first semiconductor fin and the second semiconductor fin.

15. The method of claim 14, further comprising:
after removing the second dielectric layer, forming a third dielectric layer including a first portion at a bottom sidewall of the first semiconductor fin and a second portion at a bottom sidewall of the second semiconductor fin, wherein the first dielectric layer contacts the first portion and the second portion.

16. The method of claim 15, wherein an upper surface of the first portion is higher than an uppermost surface of the first dielectric layer on the upper surface of the substrate between the first semiconductor fin and the second semiconductor fin in a cross-sectional view.

17. The method of claim 16, wherein an angle between the upper surface of the first portion and the uppermost surface of the first dielectric layer on the upper surface of the substrate between the first semiconductor fin and the second semiconductor fin is in a range between 130 degrees and 145 degrees.

18. The method of claim 14, wherein the first dielectric layer is silicon nitride with a first concentration of nitrogen, wherein the second dielectric layer is silicon nitride with a second concentration of nitrogen, wherein the first concentration of nitrogen is different than the second concentration of nitrogen.

19. The method of claim 18, wherein the first concentration of the element is greater than the second concentration of the element.

20. The method of claim 14, wherein forming the first dielectric layer and forming the second dielectric layer are performed using an atomic layer deposition process.

* * * * *